(12) United States Patent
Seo et al.

(10) Patent No.: US 8,949,687 B2
(45) Date of Patent: Feb. 3, 2015

(54) MEMORY DEVICE AND MEMORY SYSTEM

(75) Inventors: Man-keun Seo, Hwaseong-si (KR); Jun-jin Kong, Yongin-si (KR); Kyoung-Lae Cho, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 86 days.

(21) Appl. No.: 13/396,791

(22) Filed: Feb. 15, 2012

(65) Prior Publication Data

US 2012/0216096 A1    Aug. 23, 2012

(30) Foreign Application Priority Data

Feb. 23, 2011    (KR) .................. 10-2011-0016028

(51) Int. Cl.
| G11C 29/00 | (2006.01) |
| H03M 7/30 | (2006.01) |
| H03M 13/05 | (2006.01) |
| G06F 11/10 | (2006.01) |

(52) U.S. Cl.
CPC ............. H03M 7/30 (2013.01); H03M 13/05 (2013.01); G06F 11/1044 (2013.01)
USPC ........................................ 714/763

(58) Field of Classification Search
CPC ..... G06F 9/465; G06F 9/541; G06F 11/1044; H03M 13/05; H03M 7/30
USPC .................. 714/763, E11.034; 711/103
See application file for complete search history.

(56) References Cited

U.S. PATENT DOCUMENTS

2010/0088464 A1 *   4/2010   Yang .................. 711/103

FOREIGN PATENT DOCUMENTS

| JP | 2000-261630 | 9/2000 |
| KR | 10-2007-0031647 | 3/2007 |

* cited by examiner

Primary Examiner — Guy Lamarre
(74) Attorney, Agent, or Firm — Myers Bigel Sibley & Sajovec, P.A.

(57) ABSTRACT

A memory device and a memory system, the memory system including a data compressor for generating compressed data by compressing program data in a first unit, and an error correction block generator for dividing the compressed data in a second unit to obtain a plurality of pieces of normal data, and generating error correction blocks for correcting errors of the plurality of pieces of normal data, wherein each of the error correction blocks comprises the normal data, invalid data having a size corresponding to the size of the normal data, and parities for the normal data and the invalid data.

20 Claims, 10 Drawing Sheets

MEMORY DEVICE AND MEMORY SYSTEM

REFERENCE TO PRIORITY APPLICATION

This application claims the benefit of Korean Patent Application No. 10-2011-0016028, filed Feb. 23, 2011, the disclosure of which is hereby incorporated herein by reference.

FIELD

This invention relates to memory devices and memory systems and, more particularly, to memory devices for storing compressed data efficiently and memory systems for storing the compressed data efficiently.

BACKGROUND

To use a storage space effectively in a non-volatile memory device, data may be compressed and the compressed data may be stored in the storage space. Furthermore, a method of storing the compressed data effectively is required.

SUMMARY

According to an aspect of the inventive concept, there is provided a memory system including a data compressor for generating compressed data by compressing program data in a first unit; and an error correction block generator for dividing the compressed data in a second unit to obtain a plurality of pieces of normal data, and generating error correction blocks for correcting errors of the plurality of pieces of normal data, wherein each of the error correction blocks comprises the normal data, invalid data having a size corresponding to the size of the normal data, and parities for the normal data and the invalid data.

The first unit may correspond to the number of logic pages including a part or all of the program data. The second unit may correspond to the number of the error correction blocks. The size of the normal data may be a value obtained by dividing the compressed data by the number of the error correction blocks or a value that is the sum of a quotient value obtained by dividing the size of the compressed data by the number of the error correction blocks and a remainder value obtained by dividing the size of the compressed data by the number of the error correction blocks. The error correction blocks may be included in a physical page.

Among the plurality of pieces of normal data, a normal data having a size may be included in one of error correction blocks located in first and last ends of the physical page, wherein the size is the value that is the sum of a quotient value obtained by dividing the size of the compressed data by the number of the error correction blocks and a remainder value obtained by dividing the size of the compressed data by the number of the error correction blocks. The compressed data may include header information, and the header information may be included in the error correction blocks and may have a size that is smaller than the size of the normal data. Each bit of the invalid data may have a same value. The error correction block generator may include a data split unit dividing the compressed data by the number of the error correction blocks, and outputting the plurality of pieces of normal data; and an error correction encoding unit generating the error correction blocks corresponding to the plurality of pieces of normal data, respectively. The memory system may further include a memory device storing the error correction blocks; and a memory controller controlling the storing of the error correction blocks to the memory device, and controlling reading of the error correction blocks from the memory device.

Both of the data compressor and the error correction block generator may be included in the memory controller or in the memory device. The data compressor may be included in the memory controller, and the error correction block generator may be included in the memory device. The memory system may further include an error correction decoding unit receiving the error correction blocks stored in the memory device and correcting at least one error in the normal data by decoding the error correction blocks, wherein the error correction decoding unit does not perform error correction for the invalid data. The first unit and the second unit may be determined differently depending on a degree of importance of the program data.

According to another aspect of the inventive concept, there is provided a memory device for storing a physical page including compressed data in which a plurality of logic pages are compressed, wherein the physical page includes a plurality of error correction blocks, and each of the plurality of error correction blocks includes normal data which includes a part of the compressed data, invalid data having a size corresponding to a size of the normal data, and parities for the normal data and the invalid data.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
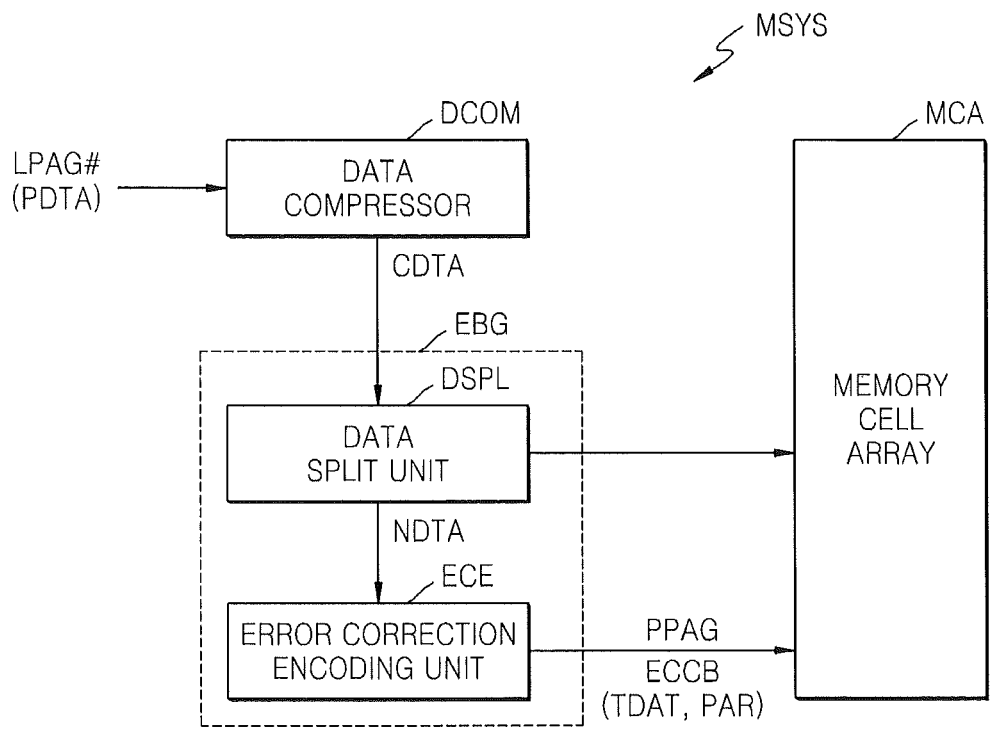
FIG. 1 is a block diagram of a memory system according to an embodiment of the inventive concept.

The attached drawings for illustrating exemplary embodiments of the inventive concept are referred to in order to gain a sufficient understanding of the inventive concept, the merits thereof accomplished by the implementation of the inventive concept. Hereinafter, the inventive concept will be described in detail by explaining exemplary embodiments thereof with reference to the attached drawings. Like reference numerals in the drawings denote like elements.

FIG. 1 is a block diagram of a memory system MSYS according to an embodiment of the inventive concept. Referring to FIG. 1, the memory system MSYS includes a data compressor DCOM and an error correction block generator EBG. The data compressor DCOM compresses program data PDTA in a first unit and generates compressed data CDTA. Here, the first unit may be the number of logic pages LPAG# which are used to compress the received program data PDTA and generate the compressed data CDTA, by the data compressor DCOM. That is, the first unit may be determined so that the first unit corresponds to the number of logic pages LPAG#. For example, the data compressor DCOM may compress two logic pages, that is, first and second logic pages LPAG1 and LPAG2 to generate the single compressed data CDTA. A host device (not shown) which controls the memory system MSYS according to the present embodiment of the inventive concept, may transmit the program data PDTA to the memory system MSYS in the form of the logic pages LPAG#. That is, the logic pages LPAG# may include some or all of the program data PDTA.

However, the inventive concept is not limited to this embodiment. The data compressor DCOM according to an embodiment of the inventive concept may configure the first unit differently depending on the degree of importance of the program data PDTA, and perform a compression based on the differently configured first unit. When the program data PDTA is compressed and stored in a memory cell array MCA, the efficiency of a storage space, that is, the memory cell array MCA may be increased and the performance of the memory system MSYS may be improved, but a data loss may occur due to the compression and restoration. Accordingly, if the degree of importance of the program data PDTA is high, for example, if the program data PDTA is meta-data, the first unit may be determined to be a small number of logic pages because the reliability of data is more important than the efficiency of the storage space.

Referring to FIG. 1, the error correction block generator EBG according to an embodiment of the inventive concept may include a data split unit DSPL dividing the compressed data CDTA into a plurality of pieces of normal data NDTA, and an error correction encoding unit ECE generating an error correction block ECCB for each of the plurality of pieces of the normal data NDTA. The error correction encoding unit ECE may be an error correction code (ECC) encoder. The error correction encoding unit ECE transmits the error correction block ECCB which includes the normal data NDTA, invalid data BS1 through BS4 (refer to FIG. 5), and a parity PAR for combined data TDTA including the normal data NDTA and the invalid data BS1 through BS4, to the memory cell array MCA. The operation of the error correction block generator EBG and the structure of the error correction blocks ECCB will be explained in detail below.

Figure 2:
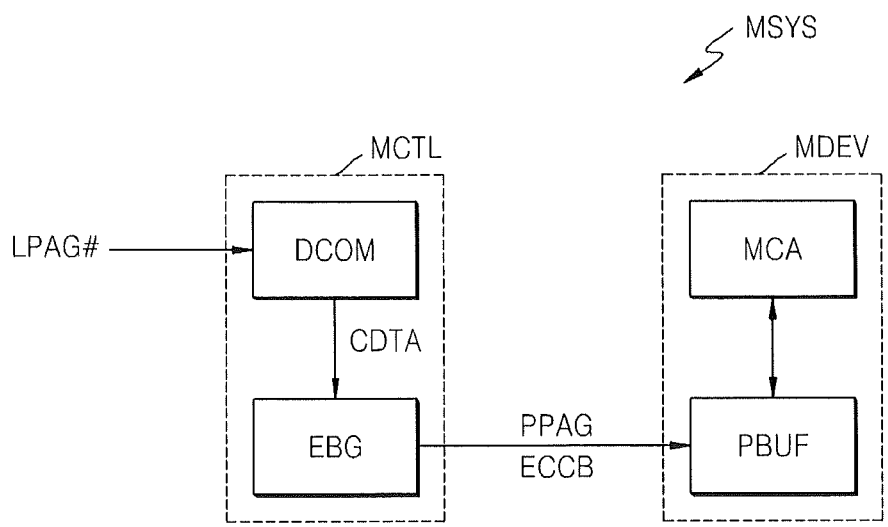
FIGS. 2 through 4 are block diagrams illustrating various embodiments of the inventive concept, in which a data compressor and an error correction block generator, which are illustrated in FIG. 1, are included in different locations.
Figure 3:
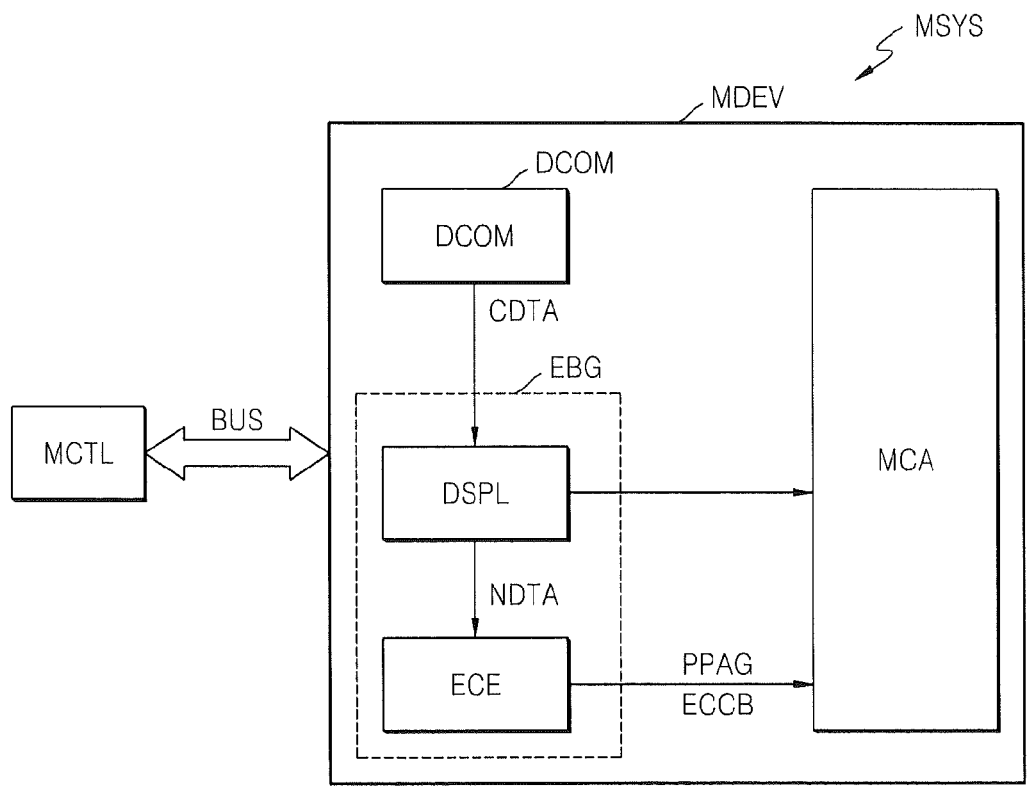
Figure 4:
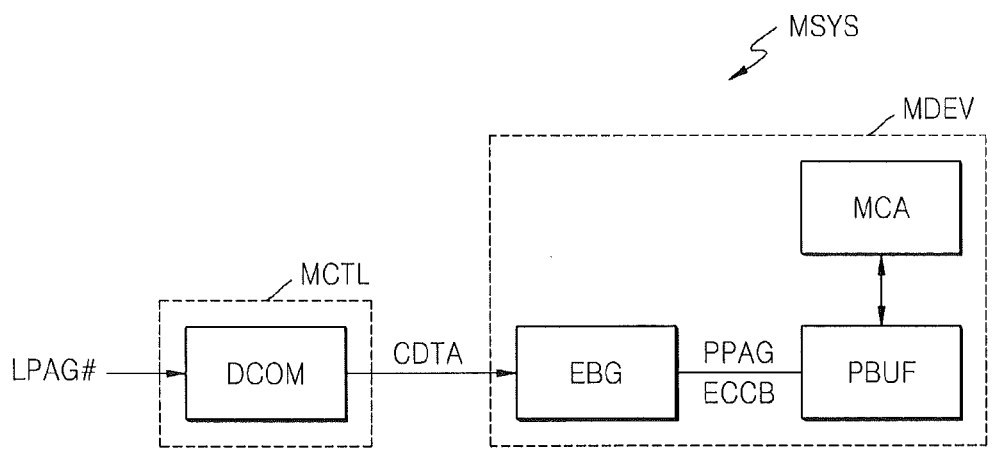

FIGS. 2 through 4 are block diagrams illustrating various embodiments of the inventive concept, in which the data compressor DCOM and the error correction block generator EBG, which are illustrated in FIG. 1, are included in different locations. Referring to FIG. 2, the data compressor DCOM and the error correction block generator EBG may be included in a memory controller MCTL of a memory system MSYS. The memory controller MCTL controls storing of the error correction block ECCB in a memory device MDEV and controls reading of the error correction block ECCB from the memory device MDEV. The memory device MDEV receives the error correction block ECCB or a physical page PPAG including the error correction blocks ECCB. The error correction block ECCB or the physical page PPAG may be received via a page buffer PBUF of the memory device MDEV and then be stored in the memory cell array MCA of the memory device MDEV. In this case, normal data NDTA included in the error correction block ECCB may be stored in a normal data region (not shown) of the memory cell array MCA, and a parity PAR included in the error correction block ECCB may be stored in a parity region (not shown) of the memory cell array MCA. In the current embodiment, the memory cell array MCA may be a non-volatile memory cell array, and particularly a NAND flash memory cell array.

As illustrated in FIG. 2, in the case where the data compressor DCOM and the error correction block generator EBG are included in the memory controller MCTL, the size of the memory device MDEV may be reduced. Furthermore, in the case where the memory system MSYS includes a plurality of memory devices like the memory device MDEV of FIG. 2, the data compressor DCOM and the error correction block generator EBG may be shared by the plurality of memory devices, and thus a total size of the memory system MSYS may be reduced.

In contrast, in FIG. 3, the data compressor DCOM and the error correction block generator EBG are included in the memory device MDEV. The memory device MDEV may be connected to the memory controller MCTL through a bus BUS. In the case where the data compressor DCOM and the error correction block generator EBG are included in the memory device MDEV, the amount of data transmitted through the bus BUS may be reduced. A load on the bus BUS may be increased in the case where the number of memory devices connected to a single memory controller increases, but the memory system MSYS of FIG. 3 may increase the transmission efficiency of the bus BUS, and thus the operation speed of the memory system MSYS may be improved. The data compressor DCOM and the error correction block generator EBG according to the present embodiment of the inventive concept may have the structure of FIG. 2 or FIG. 3 according to a specification required by the memory system MSYS. Furthermore, as illustrated in FIG. 4, the data compressor DCOM may be included in the memory controller MCTL and the error correction block generator EBG may be included in the memory device MDEV.

Figure 5:
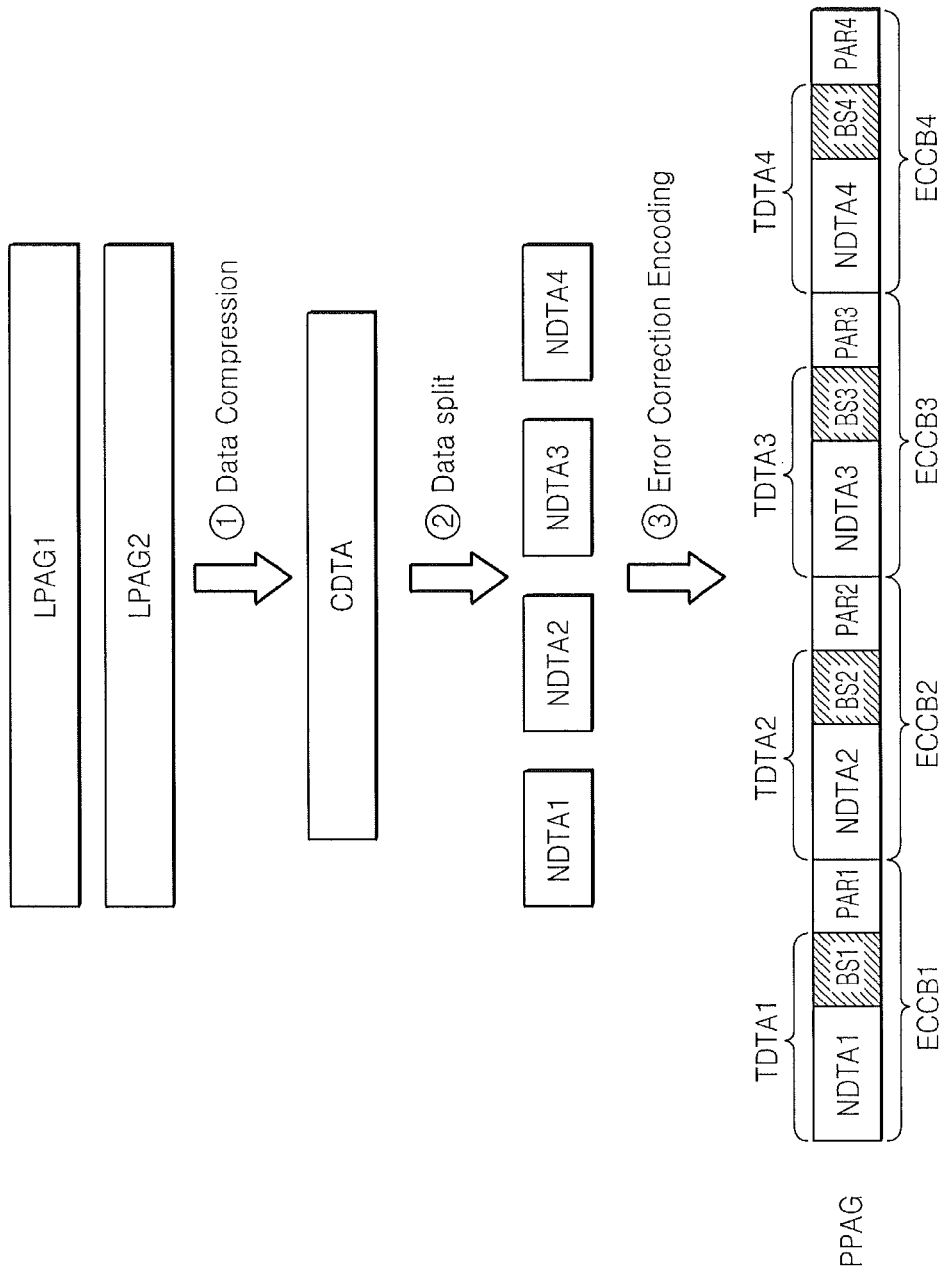
FIG. 5 is a diagram for explaining a process in which a physical page is generated in the memory system of FIG. 1.

The structures and operations of the data compressor DCOM and the error correction block generator EBG will be explained below without consideration of where the data compressor DCOM and the error correction block generator EBG are included. FIG. 5 is a diagram illustrating operations of the data compressor DCOM and the error correction block generator EBG in FIG. 1, according to an embodiment of the inventive concept. Referring to FIGS. 1 and 5, the data compressor DCOM compresses two logic pages LPAG1 and LPAG2 and generates the compressed data CDTA (operation ①). The data split unit DSPL of the error correction block generator EBG divides the compressed data CDTA into a plurality of pieces of normal data NDTA1 through NDTA4 (operation ②). FIG. 5 illustrates an example in which the compressed data CDTA is divided into 4 pieces of normal data NDTA1 through NDTA4. Here, the number of the normal data NDTA1 through NDTA4, that is, the number by which the compressed data CDTA is divided, may be the number of error correction blocks ECCB1 through ECCB4 included in a single physical page PPAG. That is, referring to FIG. 5, since the single physical page PPAG includes the four error correction blocks ECCB1 through ECCB4, the compressed data CDTA may be divided into the four normal data NDTA1 through NDTA4. Here, the sizes of the error correction blocks ECCB1 through ECCB4 may be equal. Furthermore, the normal data NDTA1 through NDTA 4 also may have the same size. That is, the sizes of the normal data NDTA1 through NDTA 4 may be a value obtained by dividing the compressed data CDTA by the number of the error correction blocks ECCB1 through ECCB4.

Next, an error correction encoding operation is performed (operation ③). The normal data NDTA1 through NDTA 4 may be included in the corresponding error correction blocks ECCB1 through ECCB4, respectively. For example, the first normal data NDTA1 may be included in the first error correction block ECCB1, and the second normal data NDTA2 may be included in the second error correction block ECCB2. Furthermore, the third normal data NDTA3 may be included in the third error correction block ECCB3, and the fourth normal data NDTA4 may be included in the fourth error correction block ECCB4. Here, all of the error correction blocks ECCB1 through ECCB4 may include the normal data of the same size.

The error correction blocks ECCB1 through ECCB4 according to an embodiment of the inventive concept also include first to fourth invalid data BS1 through BS4, respectively. For example, the first invalid data BS1 may be included in the first error correction block ECCB1, and the second invalid data BS2 may be included in the second error correction block ECCB2. Furthermore, the third invalid data BS3 may be included in the third error correction block ECCB3, and the fourth invalid data BS4 may be included in the fourth error correction block ECCB4. Here, the invalid data BS1 through BS4 may have a size corresponding to the size of the normal data NDTA1 through NDTA4. That is, the invalid data BS1 through BS4 are included in regions other than parities PAR1 through PAR4 and the normal data NDTA1 through NDTA4 in the error correction blocks ECCB1 through ECCB4, respectively. Accordingly, if the sizes of the error correction blocks ECCB1 through ECCB4 are the same as each other and the sizes of the normal data NDTA1 through NDTA4 are the same as each other, the sizes of the invalid data BS1 through BS4 may be also the same as each other.

Each of the error correction blocks ECCB1 through ECCB4 according to the present embodiment of the inventive concept includes a parity PAR which is generated by error-correcting and encoding the data therein, i.e., the normal data NDTA and the invalid data BS (hereinafter referred to as 'combined data TDTA'). For example, the first parity PAR1 for first combined data TDTA1 may be included in the first error correction block ECCB1, and the second parity PAR2 for second combined data TDTA2 may be included in the second error correction block ECCB2. Furthermore, the third parity PAR3 for third combined data TDTA3 may be included in the third error correction block ECCB3, and the fourth parity PAR4 for fourth combined data TDTA4 may be included in the fourth error correction block ECCB4. As explained above, the error correction encoding unit ECE according to the embodiment of the inventive concept may be an ECC encoder.

However, all bits of the invalid data BS1 through BS4 may have the same value. For example, all bits of the invalid data BS1 through BS4 may be regarded as logic "0". Alternatively, all bits of the invalid data BS1 through BS4 may be regarded as logic "1". Accordingly, the parity PAR for the combined data TDTA may be generated independent of the invalid data BS. In other words, the invalid data BS1 through BS4 may be processed as a surplus region in which no value is stored. This surplus region is not centralized in only one or more error correction blocks but is dispersed in a large number of error correction blocks, and thus the size of the parity capable of being allocated to the valid data (the normal data) may be increase. Therefore, an error correction efficiency may be increased.

Figure 6:
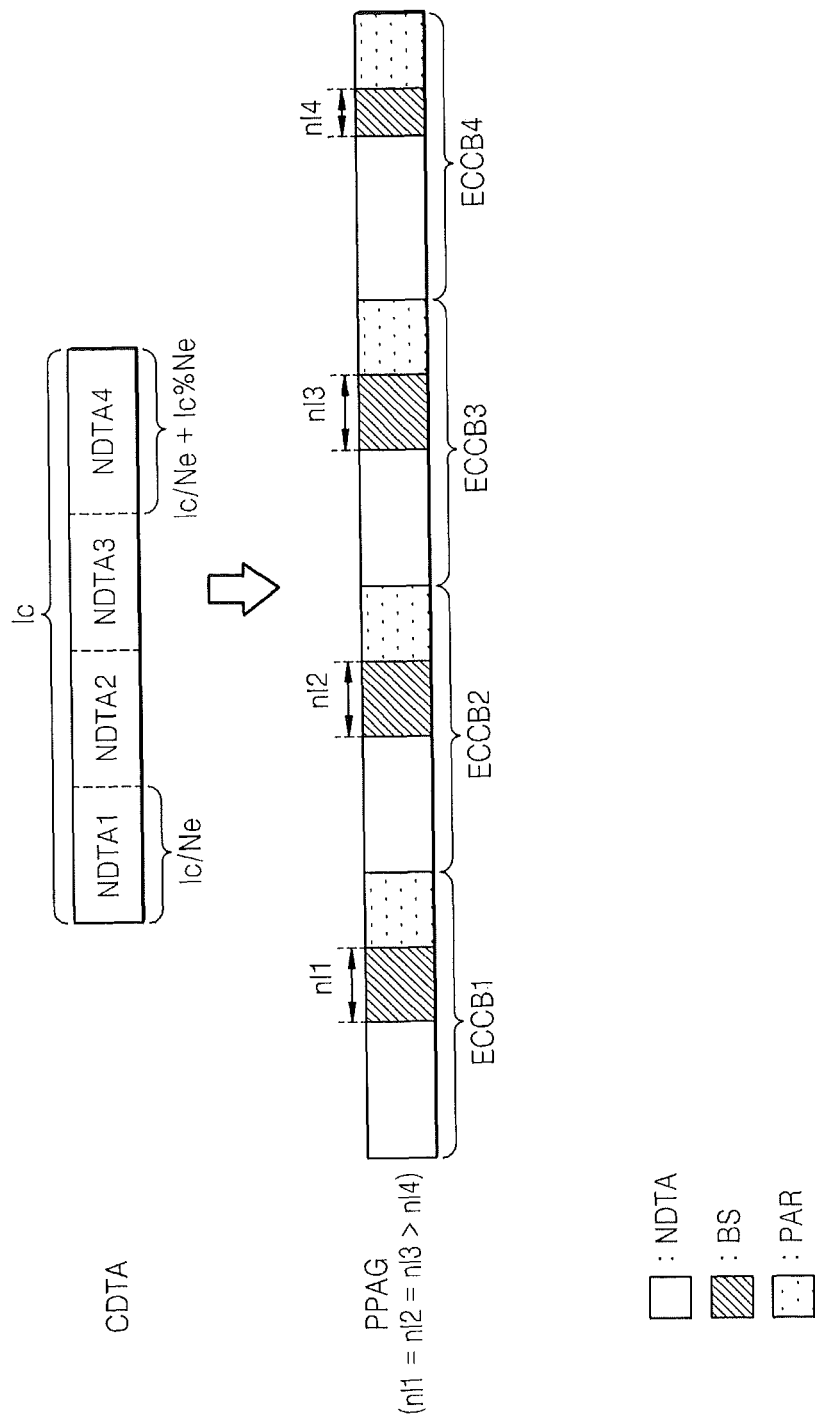
FIGS. 6 through 8 are diagrams illustrating different examples of the physical page illustrated in FIG. 5, respectively.

Various embodiments of the error correction block according to the inventive concept will be described below. Similarly to the embodiment of FIG. 5, compressed data CDTA shown in FIG. 6 is also divided according to the number of error correction blocks ECCB1 through ECCB4 included in a single physical page PPAG. Accordingly, the normal data may have a size obtained by dividing the size of the compressed data by the number of the error correction blocks. However, if the size of the compressed data CDTA is not a multiple of the number of the error correction blocks ECCB1 through ECCB4, the sizes of the normal data NDTA1 through NDTA3 may be a value Ic/Ne obtained by dividing the size Ic of the compressed data CDTA by the number Ne of the error correction blocks ECCB1 through ECCB4. On the other hand, the size of the normal data NDTA4 may be a value Ic/Ne+Ic % Ne that is the sum of a quotient value Ic/Ne obtained by dividing the size Ic of the compressed data CDTA by the number Ne of the error correction blocks ECCB1 through ECCB4 and a remainder value Ic % Ne obtained by dividing the size Ic of the compressed data CDTA by the number Ne of the error correction blocks ECCB1 through ECCB4.

Accordingly, the sizes n11 through n13 of the invalid data included in the first through third error correction blocks ECCB1 through ECCB3 of the error correction blocks ECCB1 through ECCB4 which are included in the physical page PPAG shown in FIG. 6, may be the same and may be larger than the size n14 of the invalid data included in the fourth error correction block ECCB4.

Figure 7:
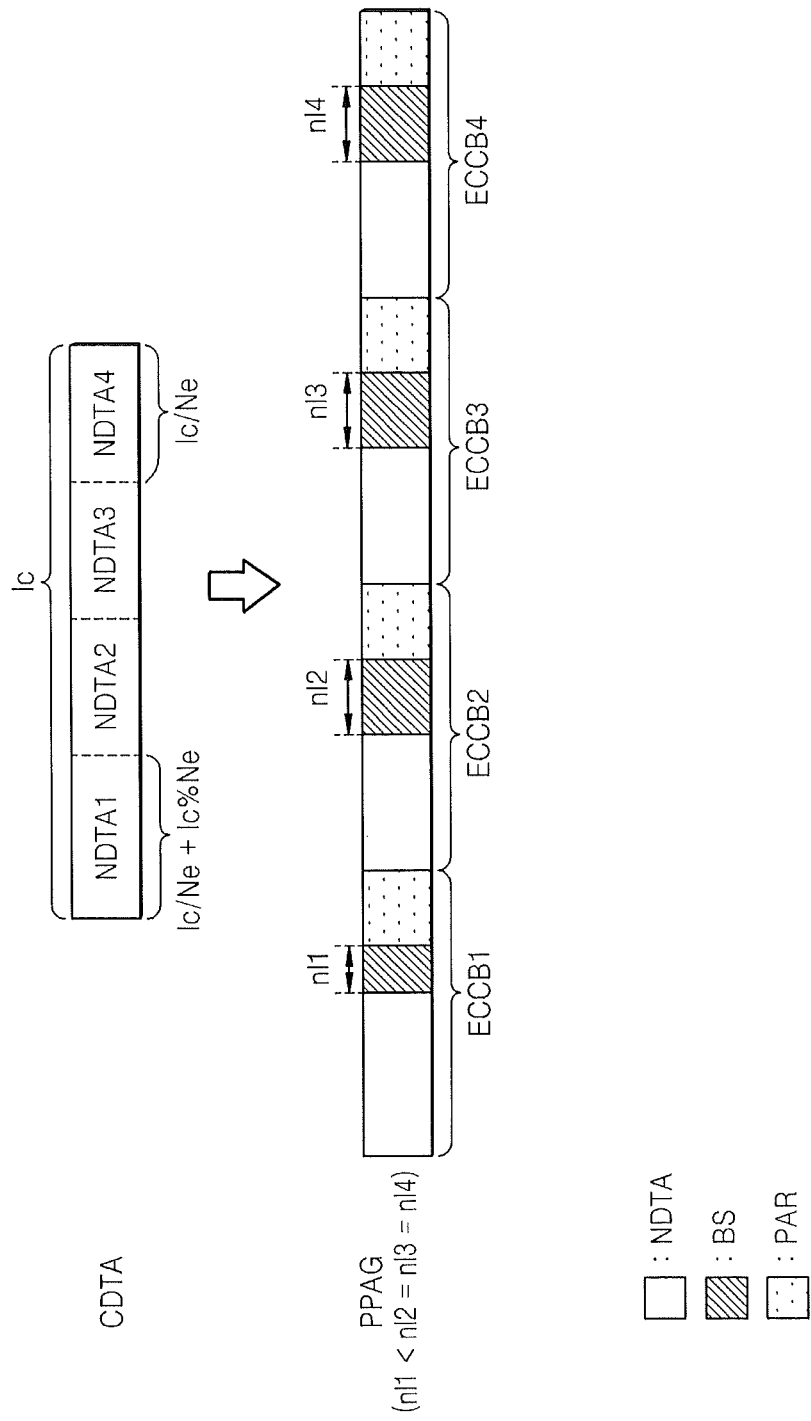

FIG. 6 illustrates an example in which the size of the fourth normal data NDTA4 including a least significant bit (LSB) of the compressed data CDTA is larger than the sizes of the other normal data NDTA1 through NDTA3, but the inventive concept is not limited thereto. For example, as illustrated in FIG. 7, the size Ic/Ne+Ic % Ne of the first normal data NDTA1 including a most significant bit (MSB) of the compressed data CDTA may be larger than the sizes Ic/Ne of the other normal data NDTA2 through NDTA4. Here, the size Ic/Ne+Ic % Ne of the first normal data NDTA1 is the sum of a quotient value Ic/Ne obtained by dividing the size Ic of the compressed data CDTA by the number Ne of the error correction blocks ECCB1 through ECCB4 and a remainder value Ic % Ne obtained by dividing the size Ic of the compressed data CDTA by the number Ne of the error correction blocks ECCB1 through ECCB4, and the sizes Ic/Ne of the other normal data NDTA2 through NDTA4 are a value obtained by dividing the size Ic of the compressed data CDTA by the number Ne of the error correction blocks ECCB1 through ECCB4. Accordingly, the size n11 of the invalid data of the first error correction block ECCB1, which includes the first normal data, of the error correction blocks ECCB1 through ECCB4 which are included in the physical page PPAG shown in FIG. 7, may be smaller than the sizes n12, n13, and n14 of the invalid data of the other error correction blocks ECCB2 through ECCB4.

Figure 8:
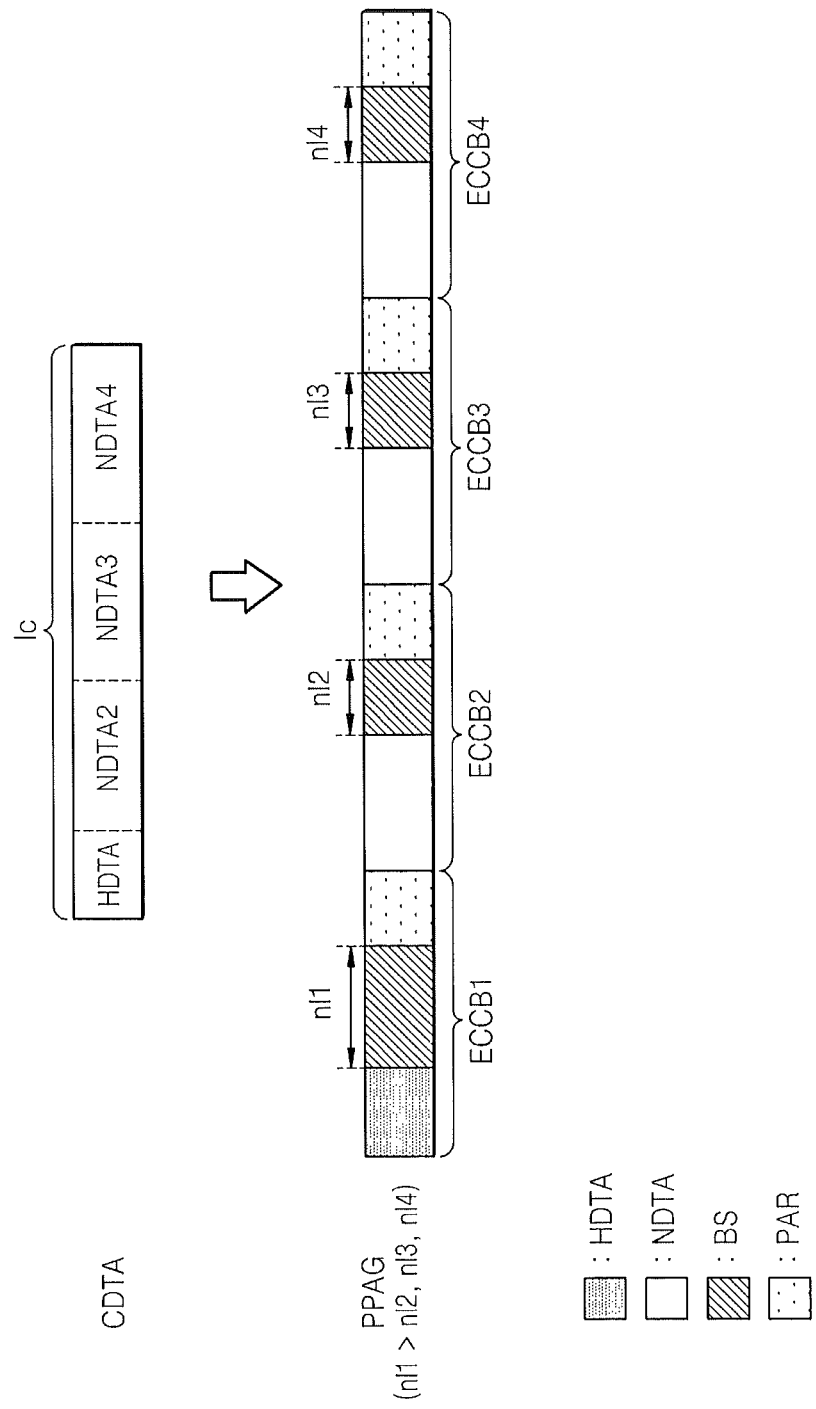

FIG. 8 illustrates a physical page PPAG where in the error correction capability for header information HDTA of compressed data CDTA is higher than error correction capabilities of other normal data NDTA2 through NDTA 4, according to an embodiment of the inventive concept. Referring to FIG. 8, the header information HDTA of the compressed data CDTA includes a code word for each of symbols included in the compressed data CDTA and may include necessary information for decoding. Accordingly, in the case where the header information HDTA of the compressed data CDTA is lost, false decoding may be performed for data included in the compressed data CDTA.

A memory device or a memory system according to an embodiment of the inventive concept may be configured so that the error correction block ECCB1 including data whose degree of importance is high as the header information HDTA, includes the invalid data BS having a larger size n11 than the sizes n12, n13, and n14 of the other error correction blocks ECCB2 through ECCB4. In this case, the size of the parity allocated according to the size of valid data, that is, the header information HDTA, is larger than the sizes of the parities for the other normal data NDTA2 through NDTA4, and thus an error correction capability for the important valid data may be improved.

Figure 9:
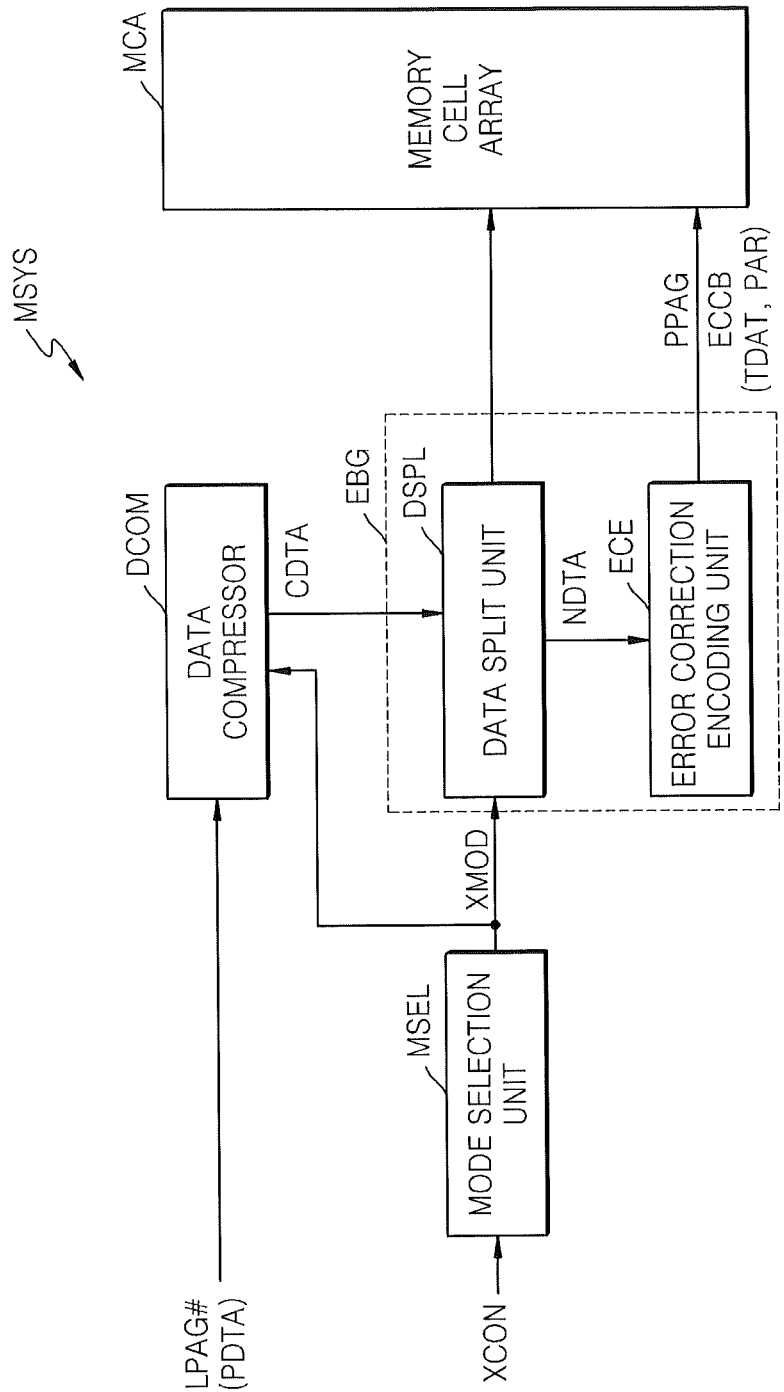
FIG. 9 is a block diagram illustrating another example of the error correction block generator illustrated in FIG. 1.

Similarly, the memory system MSYS of FIG. 1 may determine the error correction capability differently depending on the degree of importance of the program data to be stored in the memory cell array MCA. For this, as illustrated in FIG. 9, the memory system MSYS according to the present embodiment of the inventive concept may further include a mode selection unit MSEL. The mode selection unit MSEL may control the error correction capability for the normal data NDTA included in the error correction block ECCB, in response to a control signal XCON indicating the degree of importance of data. For example, a mode signal XMOD may be transmitted to the data split unit DSPL, and the data split unit DSPL may control the size of the normal data NDTA in response to the mode signal XMOD. In this case, similarly to the embodiment of FIG. 8, more parities may be allocated per unit size compared with the other valid data, by reducing the size of the important normal data. Furthermore, the mode signal XMOD may be transmitted to the data compressor DCOM, and the data compressor DCOM may control the number of logic pages LPAG# (that is, the first unit) compressed at the same time in response to the mode signal XMOD. The data compressor DCOM may lower a compression rate by reducing the first unit, that is, the number of the logic pages LPAG# for the important data, and thus the error correction efficiency may be controlled. The control signal XCON shown in FIG. 9 may be received from an external host (not shown) or via a user interface (not shown). The mode signal XMOD shown in FIG. 9 may have different logic levels or different values depending on the degree of importance of data.

Figure 10:
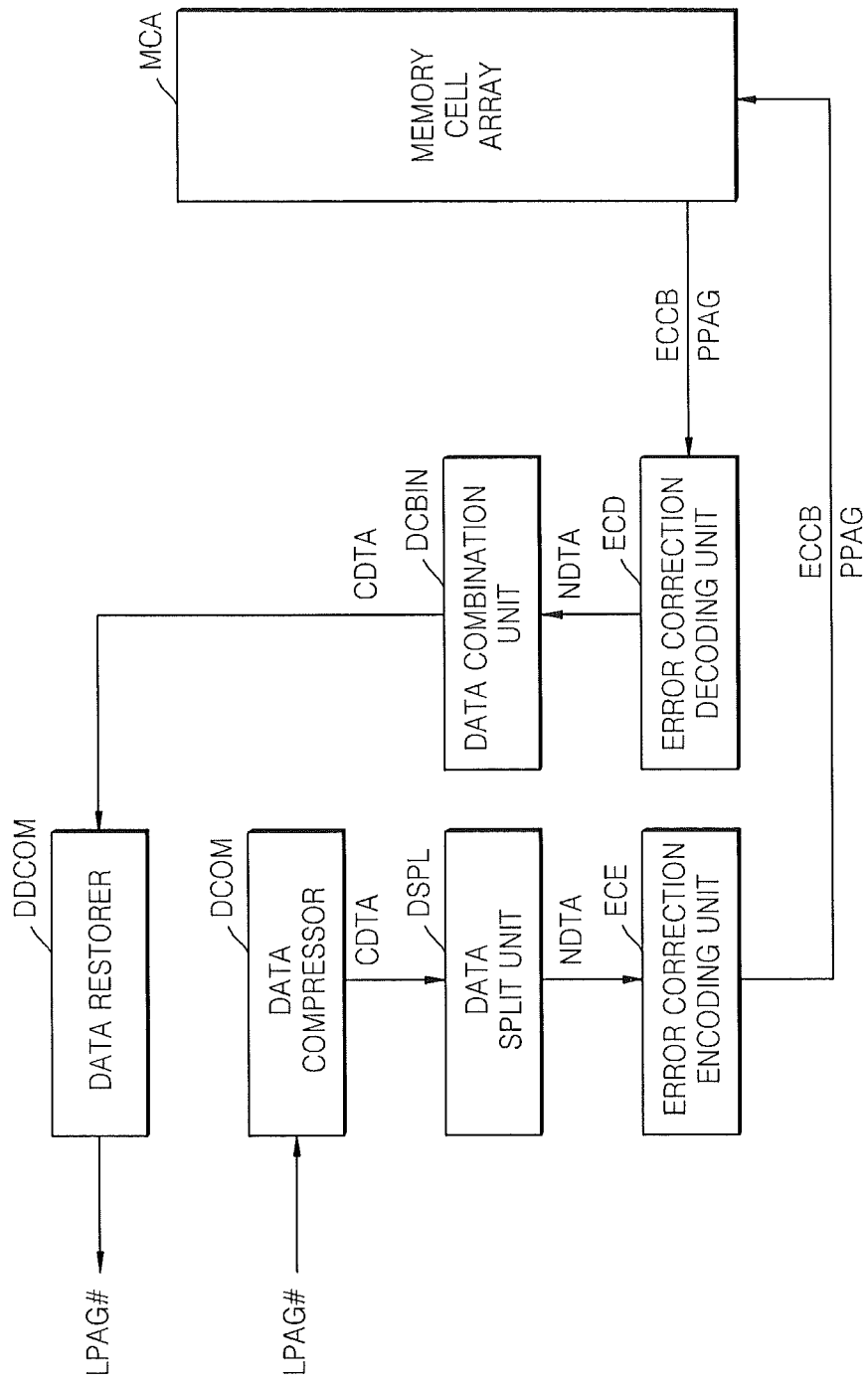
FIG. 10 is a block diagram for explaining an operation of reading data stored in the memory cell array of the memory system of FIG. 1.

FIG. 10 is a block diagram for explaining an operation of reading data stored in the memory cell array MCA of the memory system MSYS of FIG. 1. Referring to FIG. 10, a physical page PPAG or an error correction block ECCB stored in the memory cell array MCA is input to an error correction decoding unit ECD, and the error correction decoding unit ECD may decode the error correction block ECCB and output a plurality of pieces of error corrected-normal data NDTA. The error correction decoding unit ECD may perform a decoding operation regardless of whether there is an error in the invalid data BS. That is, as in FIG. 5, in decoding an error correction block including invalid data in which all bits are regarded as logic "0" or logic "1", the error correction decoding unit ECD according to the embodiment of the inventive concept may not correct an error included in the invalid data. The normal data NDTA may be transmitted to a data combination unit DCBIN, and the data combination unit DCBIN may combine the normal data NDTA and output the compressed data CDATA. A data restorer DDCOM may restore the compressed data CDTA to the logic page LPAG#.

Like this, a memory device and a memory system according to an embodiment of the inventive concept may maintain a compression rate of data, and raise the error correction capability for valid data (that is, normal data) compared with the case in which the surplus region is centralized only in some error correction blocks, by including the normal data equally in all the error correction blocks, that is, by including the invalid data (that is, the surplus region) equally in all the error correction blocks.

Figure 11:
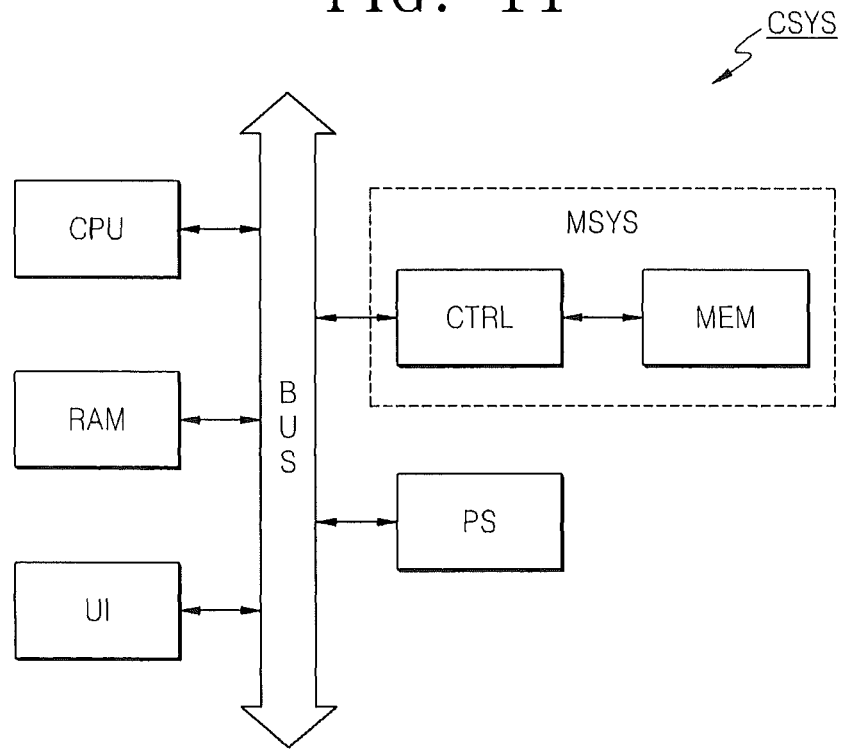
FIG. 11 is a block diagram of a computing system apparatus according to an embodiment of the inventive concept.

FIG. 11 is a block diagram of a computing system apparatus CSYS according to an embodiment of the inventive concept. The computing system apparatus CSYS according to an embodiment of the inventive concept includes a processor CPU, a user interface UI, and a semiconductor memory system MSYS that are electrically connected to a bus BUS. The semiconductor memory system MSYS includes a memory controller CTRL and a semiconductor memory device MEM. N-bit data (where N is a positive number which is equal to or greater than '1') which is processed or will be processed by the processor CPU, is stored in the semiconductor memory device MEM through the memory controller CTRL. The semiconductor memory system MSYS shown in FIG. 11 may be the same as the semiconductor memory system MSYS shown in FIG. 1.

The computing system apparatus CSYS according to an embodiment of the inventive concept further includes a power supplying apparatus PS. Furthermore, if the semiconductor memory device MEM is a flash memory device, the computing system apparatus CSYS according to an embodiment of the inventive concept may further include a volatile memory device, for example, a random access memory (RAM). In the case where the computing system apparatus CSYS according to an embodiment of the inventive concept is a mobile apparatus, a battery for supplying an operating voltage to the computing system apparatus and a modem, such as a baseband chipset, may be additionally provided. Furthermore, it will be understood by those of ordinary skill in the art that the computing system apparatus CSYS according to an embodiment of the inventive concept may further include an application chipset, a camera image processor such as a CMOS image sensor (CIS), and a mobile dynamic random access memory (DRAM), and thus further explanation will be omitted.

Figure 12:
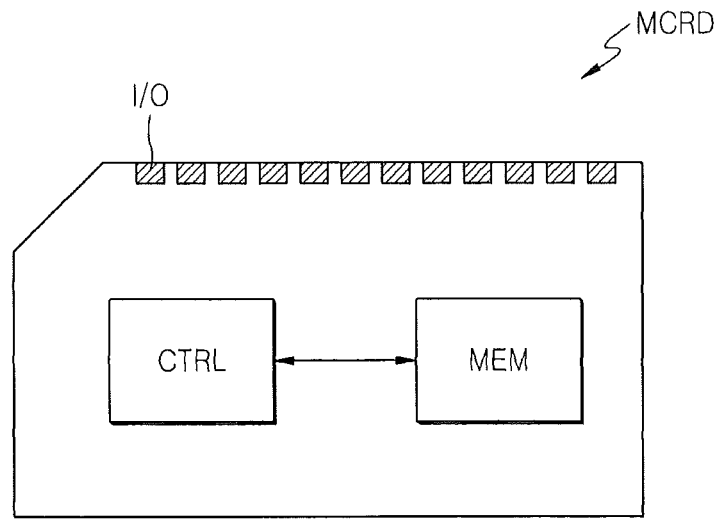
FIG. 12 is a block diagram of a memory card according to an embodiment of the inventive concept.

FIG. 12 is a block diagram of a memory card MCRD according to an embodiment of the inventive concept. Referring to FIG. 12, the memory card MCRD according to an embodiment of the inventive concept includes a memory controller CTRL and a memory device MEM. The memory controller CTRL controls writing of data to the memory device MEM and reading of data from the memory device MEM, in response to a request which is received from an external host (not shown) through an input/output terminal I/O. Furthermore, in the case where the memory device MEM shown in FIG. 12 is a flash memory device, the memory controller CTRL controls an erase operation for the memory device MEM. The memory controller CTRL of the memory card MCRD according to an embodiment of the inventive concept may include interface units (not shown) for interfacing with the external host and the memory device MEM, and a RAM to perform the above control operation. In particular, the memory controller CTRL of the memory card MCRD according to an embodiment of the inventive concept may be the memory controller CTRL shown in FIG. 2. Furthermore, the memory device MEM of the memory card MCRD according to an embodiment of the inventive concept may be the memory device MEM shown in FIG. 2. The memory card MCRD of FIG. 12 may be embodied as a compact flash card (CFC), a microdrive, a smart media card (SMC), a multimedia card (MMC), a security digital card (SDC), a memory stick, or a universal serial bus (USB) flash memory driver.

Figure 13:
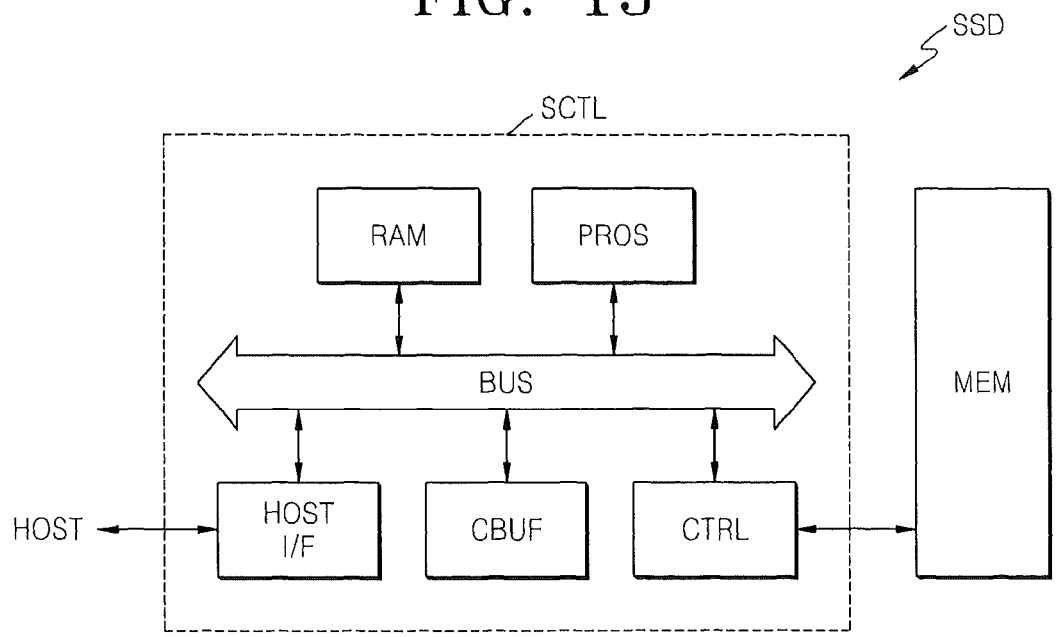
FIG. 13 is a block diagram of a solid state drive (SSD) according to an embodiment of the inventive concept.

FIG. 13 is a block diagram of a solid state drive (SSD) according to an embodiment of the inventive concept. Referring to FIG. 13, the SSD according to an embodiment of the inventive concept includes a SSD controller SCTL and a memory device MEM. The SSD controller SCTL may include a processor PROS, a random access memory RAM, a cash buffer CBUF, a memory controller CTRL, and a host interface HOST I/F, which are connected to each other through a bus BUS. The processor PROS controls that the memory controller CTRL transmits data to the memory device MEM and receives data from the memory controller MEM, in response to a request of the host (not shown), which includes a command, an address, and data. The processor PROS and the memory controller CTRL of the SSD according to an embodiment of the inventive concept may be embodied in a single advanced RISC machine (ARM) processor. Data required for the operation of the processor PROS may be loaded in the random access memory RAM.

The host interface HOST I/F receives a request from the host, and transmits the request to the processor PROS or transmits data received from the memory device MEM to the host. The host interface HOST I/F may interface with the host by various interface protocol such as universal serial bus (USB), man-machine communication (MMC), peripheral component interconnect-express (PCI-E), serial advanced technology attachment (SATA), parallel advanced technology attachment (PATA), small computer system interface (SCSI), enhanced small device interface (ESDI), and intelligent drive electronics (IDE). Data to be transmitted to the memory device MEM or data transmitted from the memory device MEM may be stored in the cash buffer CBUF temporarily. The memory controller CTRL and the memory device MEM in the SSD according to an embodiment of the inventive concept may be, respectively, the memory controller CTRL and the memory device MEM shown in FIG. 2.

Figure 14:
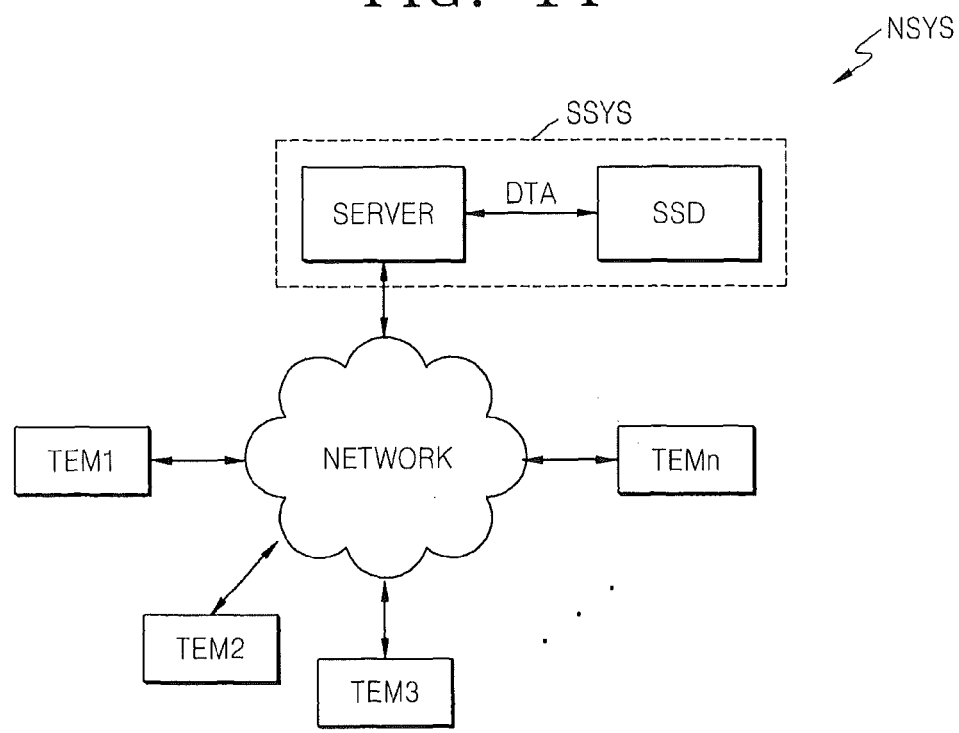
FIG. 14 is a diagram illustrating a server system including the SSD of FIG. 13, and a network system including the server system.

FIG. 14 is a diagram illustrating a server system SSYS including a SSD and a network system NSYS, according to an embodiment of the inventive concept. Referring to FIG. 14, the network system NSYS may include the server system SSYS and various terminals TEM1 through TEMn, which are connected to each other through a network. The server system SSYS according to an embodiment of the inventive concept may include a server SERVER for processing requests received from the various terminals TEM1 through TEMn connected to the network NETWORK, and the SSD for storing data corresponding to the requests received from the terminals TEM1 through TEMn. Here, the SSD illustrated in FIG. 14 may be the same as the SSD illustrated in FIG. 13. That is, the SSD illustrated in FIG. 14 may include the memory controller MCTL and the memory device MDEV illustrated in FIG. 2. Accordingly, the network system NSYS according to an embodiment of the inventive concept may improve an error correction capability regardless of the compression rate of data, in the case of embodying the server system including the SSD which provides many more storage regions and ensures reliability.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. An integrated circuit memory system, comprising:
an error correction block generator comprising a data split circuit configured to divide a string of compressed data into a plurality of strings of normal data and an error correction encoding circuit configured to encode each of the plurality of strings of normal data into a respective error correction block,
wherein each of the error correction blocks comprises combined data and an error correction code,
wherein the combined data comprises normal data and invalid data, and
wherein the error correction code is generated by encoding the combined data.

2. The memory system of claim 1, wherein the error correction codes within each error correction block signify the parity of the corresponding normal data and invalid data.

3. The memory system of claim 2, wherein the invalid data within each error correction block is defined by a string of logic bits having equivalent data values.

4. The memory system of claim 1, wherein said error correction block generator is configured to write the error correction blocks derived from the plurality of strings of normal data into an integrated circuit memory device within the memory system.

5. The memory system of claim 1, further comprising a data compressor configured to generate the string of compressed data from a plurality of pages of data.

6. A memory system comprising:
a data compressor for generating compressed data by compressing program data in a first unit; and
an error correction block generator for dividing the compressed data in a second unit to obtain a plurality of pieces of normal data, and generating error correction blocks for correcting errors of the plurality of pieces of normal data,
wherein each of the error correction blocks comprises combined data and an error correction code,
wherein the combined data comprises the normal data and invalid data, and
wherein the error correction code signifies the parity of the combined data.

7. The memory system of claim 6, wherein the first unit corresponds to the number of logic pages including a part or all of the program data.

8. The memory system of claim 6, wherein the second unit corresponds to the number of the error correction blocks.

9. The memory system of claim 6, wherein the size of the normal data is a value obtained by dividing the compressed data by the number of the error correction blocks or a value that is the sum of a quotient value obtained by dividing the size of the compressed data by the number of the error correction blocks and a remainder value obtained by dividing the size of the compressed data by the number of the error correction blocks.

10. The memory system of claim 6, wherein the error correction blocks are included in a physical page.

11. The memory system of claim 10, wherein, among the plurality of pieces of normal data, a normal data having a size is included in one of error correction blocks located in first and last ends of the physical page, wherein the size is the value that is the sum of a quotient value obtained by dividing the size of the compressed data by the number of the error correction blocks and a remainder value obtained by dividing the size of the compressed data by the number of the error correction blocks.

12. The memory system of claim 6, wherein the compressed data comprises header information, and
the header information is included in the error correction blocks and has a size that is smaller than the size of the normal data.

13. The memory system of claim 6, wherein each bit of the invalid data has a same value.

14. The memory system of claim 6, wherein the error correction block generator comprises:
a data split unit dividing the compressed data by the number of the error correction blocks, and outputting the plurality of pieces of normal data; and
an error correction encoding unit generating the error correction blocks corresponding to the plurality of pieces of normal data, respectively.

15. The memory system of claim 14, further comprising:
a memory device storing the error correction blocks; and
a memory controller controlling the storing of the error correction blocks to the memory device, and controlling reading of the error correction blocks from the memory device.

16. The memory system of claim 15, wherein both of the data compressor and the error correction block generator are included in the memory controller or in the memory device.

17. The memory system of claim 15, wherein the data compressor is included in the memory controller, and
the error correction block generator is included in the memory device.

18. The memory system of claim 15, further comprising
an error correction decoding unit receiving the error correction blocks stored in the memory device and correcting at least one error in the normal data by decoding the error correction blocks,
wherein the error correction decoding unit does not perform error correction for the invalid data.

19. The memory system of claim 6, wherein the first unit and the second unit are determined based on an error correction capacity of the memory system, and
wherein the error correction capacity is selected from a plurality of error correction capacities based on a degree of importance of the program data.

20. A memory device for storing a physical page including compressed data in which a plurality of logic pages are compressed, wherein the physical page comprises a plurality of error correction blocks,
wherein each of the plurality of error correction blocks comprises combined data and an error correction code,
wherein the combined data comprises normal data which comprises a part of the compressed data and invalid data having a size corresponding to a size of the normal data, and
wherein the error correction code comprises a parity of the combined data.

* * * * *